(12) United States Patent
Kotani et al.

(10) Patent No.: US 6,839,243 B2
(45) Date of Patent: Jan. 4, 2005

(54) ELECTRONIC COMPONENT AND METHOD OF PRODUCING THE SAME

(75) Inventors: Kenichi Kotani, Toyama-ken (JP); Masaya Wajima, Shinminato (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/372,749

(22) Filed: Feb. 24, 2003

(65) Prior Publication Data

US 2003/0161122 A1 Aug. 28, 2003

(30) Foreign Application Priority Data

Feb. 25, 2002 (JP) ........................................ 2002-048430

(51) Int. Cl.$^7$ ............................................. H01R 12/16
(52) U.S. Cl. ....................... 361/790; 361/192; 361/311; 361/306.1; 361/306.3; 310/344; 340/320
(58) Field of Search ............................... 361/790, 792, 361/820, 344, 320, 821, 508, 306.1, 306.3, 311, 313; 333/192

(56) References Cited

U.S. PATENT DOCUMENTS

| | | | | |
|---|---|---|---|---|
| 6,064,282 A | * | 5/2000 | Futakuchi et al. | ........... 333/192 |
| 6,531,806 B1 | * | 3/2003 | Daidai | ......................... 310/344 |
| 2002/0048126 A1 | * | 4/2002 | Shimazawa | |

* cited by examiner

*Primary Examiner*—Kamand Cuneo
*Assistant Examiner*—Hung S. Bui
(74) *Attorney, Agent, or Firm*—Keating & Bennett, LLP

(57) ABSTRACT

An electronic component includes a laminate having a structure in which an element substrate and a sealing substrate are bonded to each other through an adhesive layer, a terminal electrode is arranged on the element substrate so as to be exposed at an end surface of the laminate, an outside electrode is disposed on the outer surface of the sealing substrate, the terminal electrode and the outside electrode are electrically connected to each other through an end surface electrode disposed on the end surface of the laminate, and the thickness of the end surface electrode is between about one half of the thickness of the adhesive layer and about five times of the thickness thereof.

12 Claims, 9 Drawing Sheets

ELECTRONIC COMPONENT AND METHOD OF PRODUCING THE SAME

BACKGROUND OF THE INVENTION

1. Field of the Invention

The present invention relates to an electronic component such as a lamination-type piezoelectric resonator component, having a structure in which an element substrate having an electronic component element disposed thereon is laminated to a sealing substrate via an adhesive layer, and to a method of producing such an electronic component.

2. Description of the Related Art

Heretofore, various types of lamination-type piezoelectric resonator components, in each of which element substrates are bonded to the upper and lower surfaces of an energy-trap type piezoelectric resonator element through adhesives, have been proposed. For example, Japanese Unexamined Patent Application Publication No. 8-23253 discloses a piezoelectric resonator component in which sealing substrates are bonded to an element substrate having at least two energy trap type piezoelectric resonating portions mounted on both main surfaces thereof via adhesives, respectively.

An example of the configuration of this type of related art piezoelectric resonator component will be described with reference to FIG. 8.

In a piezoelectric resonator component 101, sealing substrates 105 and 106 are bonded to the upper and lower surfaces of an element substrate 102 through adhesive layers 103 and 104. First and second energy trap type piezoelectric resonating portions 107 and 108 are disposed on the element substrate 102. The piezoelectric resonating portions 107 and 108 contain vibration electrodes 107a, 107b, 108a, and 108b which are disposed on both the main surfaces of the element substrate 102, respectively.

The vibration electrodes 107a and 108a are connected to terminal electrodes 109 and 110 in the portions of the component not shown in FIG. 8. Moreover, the vibration electrodes 107a and 108a are also connected to a capacitor electrode 111. On the other hand, the vibration electrodes 107b and 108b are electrically connected to a capacitor electrode 112 on the lower surface of the element substrate 102.

Thus, a capacitor-containing piezoelectric oscillator having the two piezoelectric resonating portions and one capacitor is provided.

The sealing substrates 105 and 106 are bonded through the adhesive layers 103 and 104 so as to define spaces which prevent disturbance of the vibration of the piezoelectric resonating portions 107 and 108. Moreover, end surface electrodes 113 and 114 are disposed on the end surfaces of the laminate including the element substrate 102 and the sealing substrates 103 and 104, respectively. The end surface electrodes 113 and 114 are electrically connected to the terminal electrodes 109 and 110.

External electrodes 115 to 118 are disposed on the upper and lower surfaces of the laminate. The external electrodes 115 and 116 are electrically connected to the end surface electrode 113. The external electrodes 117 and 118 are electrically connected to the end surface electrode 114.

Also, an external electrode 121 is disposed in the center of the laminate so as to wind around the upper surface, a pair of the side surfaces, and the lower surface of the laminate. The external electrode 121 is electrically connected to the capacitor electrode 112.

Referring to the production of the piezoelectric resonator component 101, a mother laminate is prepared for improving productivity. The mother laminate is cut in the thickness direction, so that laminates as individual units of the piezoelectric resonator component 101 excluding the end surface electrodes 113 and 114 are produced. Thereafter, a pair of the end surfaces of the laminate onto which the terminal electrodes 109 and 110 are exposed are surface-roughened by sand-blasting or barrel polishing. The surface-roughening is carried out in order to securely expose the end surfaces of the terminal electrodes 109 and 110 and also to improve the bond strength of the end surface electrodes. Thereafter, the end surface electrodes 113 and 114 are formed by a thin-film forming technique such as vapor-deposition, sputtering, or the like.

As described above, prior to the formation of the end surface electrodes 113 and 114 in the production of the piezoelectric resonator component 101, the surface-roughening for exposure of the end surfaces of the terminal electrodes 119 and 110 is carried out. In this case, the adhesive layers 103 and 104 are also scraped off by the polishing. The adhesive layers 103 and 104 are formed from an epoxy adhesive having a high bond strength. The epoxy adhesive having a superior bond strength presents a high stiffness when the adhesive is completely cured. Therefore, when the sand-blasting or the barrel-polishing is carried out, the adhesive layers 103 and 104 are scraped off as shown in FIG. 9 and readily recede from the end surface of the laminate toward the inside thereof. That is, the outside ends 103a and 104a of the adhesive layers 103 and 104 readily recede inward of the laminate from the end surface thereof. In the case where the receding amount is large, the end surface electrode 113, which is formed by vapor deposition or sputtering, may be broken and separated as shown in FIG. 9. In particular, for the end surface electrode 113 formed by a thin-film forming technique such as vapor deposition and sputtering, the film is relatively thin. On the other hand, the adhesive layers 113 and 114 have thicknesses such that they can define spaces which prevent disturbance of the vibration in the thickness direction of the piezoelectric resonating portions 107 and 108.

Accordingly, when the outside ends 103a and 104a of the adhesive layers 103 and 104 recede, the end surface electrode 113 may be broken and separated at the outside ends 103a and 104a of the adhesive layers 103 and 104, so that the electrical connection of the terminal electrode 109 to the outside electrodes 115 and 116 can not be achieved. Moreover, even if the electrical connection is achieved, the reliability of the electrical connection between the end surface electrode portions disposed on the element substrate 102 and the end surface electrode portions disposed on the sealing substrates 103 and 104 may be insufficient.

SUMMARY OF THE INVENTION

In order to overcome the problems described above, preferred embodiments of the present invention provide an electronic component with a high reliability of electrical connection, having a laminate including an element substrate and sealing substrates laminated to each other, in which terminal electrodes disposed on the element substrate and outside electrodes disposed on the sealing substrates are connected securely and electrically to end surface electrodes.

According to a first preferred embodiment of the present invention, an electronic component includes an element substrate having an electronic component element disposed therein, an adhesive layer disposed on at least one side of the element substrate, a sealing substrate bonded to the element substrate through the adhesive layer, a terminal electrode disposed on the side of the element substrate adjacent to the adhesive layer so as to be exposed on an end surface of the laminate including the element substrate, the adhesive layer, and the sealing substrate, an outside electrode disposed on the outer surface of the sealing substrate, and an end surface electrode disposed on the end surface of the laminate, wherein the thickness of the end surface electrode is between about one half of the thickness of the adhesive layer and about five times of the thickness thereof.

Accordingly, an electrode material for forming the end surface electrode is securely filled into a gap defined between the element substrate and the sealing substrate. Thus, the terminal electrode is electrically connected securely and reliably to the outside electrode disposed on the sealing substrate via the end surface electrode. The reliability of the electrical connection is therefore very high.

Preferably, the adhesive layers are disposed on both sides of the element substrate, and the sealing substrates are bonded to both the sides of the element substrate through the adhesive layers. Thus, the electronic component is a lamination type in which the element substrate is sandwiched between a pair of the sealing substrates.

Preferably, the element substrate includes an energy trap type piezoelectric resonating portion. The lamination type piezoelectric resonator component according to a preferred embodiment of the present invention has a high reliability of electrical connection.

According to a second preferred embodiment of the present invention, a method of producing an electronic component having a laminate in which a sealing substrate is laminated to at least one side of an element substrate through an adhesive layer, includes the steps of preparing the element substrate having a terminal electrode on one main surface thereof and the sealing substrate, the terminal electrode being extended to an end surface of the laminate, bonding the sealing substrate to the one main surface of the element substrate having the terminal electrode disposed thereon through the adhesive layer, and forming an end surface electrode having a thickness between about one half of the thickness of the adhesive layer and about five times of the thickness thereof on the end surface of the laminate so as to be electrically connected to the terminal electrode.

Even if the adhesive layer is caused to recede in the gap between the element substrate and the sealing substrate, the terminal electrode on the element substrate can be electrically connected firmly and reliably to an electrode disposed on the outer surface of the sealing substrate, since an electrode material for forming the end surface electrode is sufficiently filled into the gap. Thus, an electronic component having a high reliability of electrical connection is provided.

Preferably, the adhesive layers are disposed on both sides of the element substrate, and the sealing substrates are bonded to both sides of the element substrate through the adhesive layers. Thus, the lamination type electronic component in which the element substrate is bonded to and between a pair of the sealing substrates through the adhesive layers is provided.

Also, preferably, the end surface of the laminate is surface-roughened, e.g., by barrel-polishing or sandblasting prior to the formation of the end surface electrode. Thus, the terminal electrode is securely exposed at the end surface of the laminate. The bond strength of the end surface electrode is significantly increased, and the reliability of the electrical connection is greatly improved.

Also, preferably, the end surface of the laminate is surface-roughened before the adhesive layer is completely cured. This prevents the outside end of the adhesive layer from being scraped off in the end surface roughing process. Accordingly, the receding degree of the outside end of the adhesive layer is reduced, and thereby, the reliability of the electrical connection is further improved.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The present invention will be more apparent from the following description of preferred embodiments of the present invention.

Figure 1A:
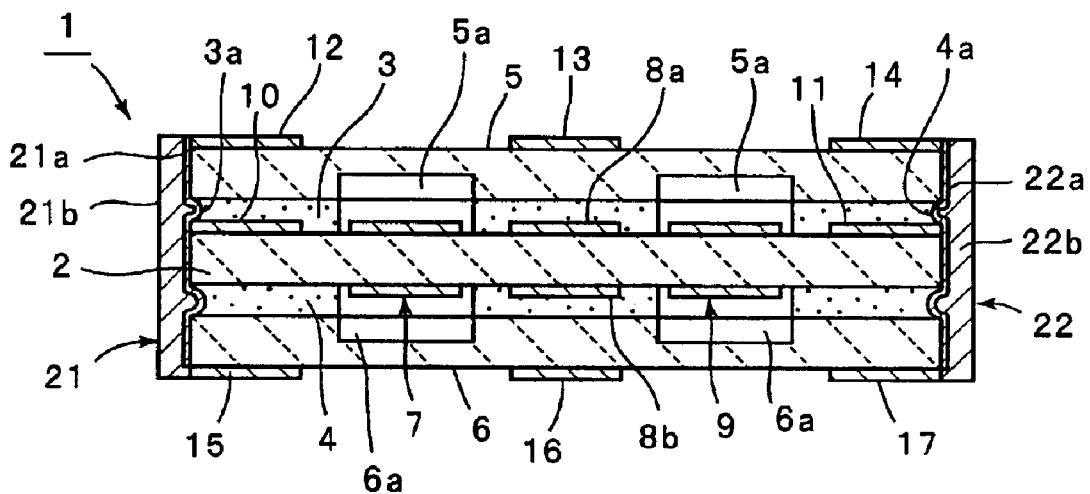
FIG. 1A is a cross-sectional front view of a piezoelectric resonator component according to a preferred embodiment of the present invention.
Figure 1B:
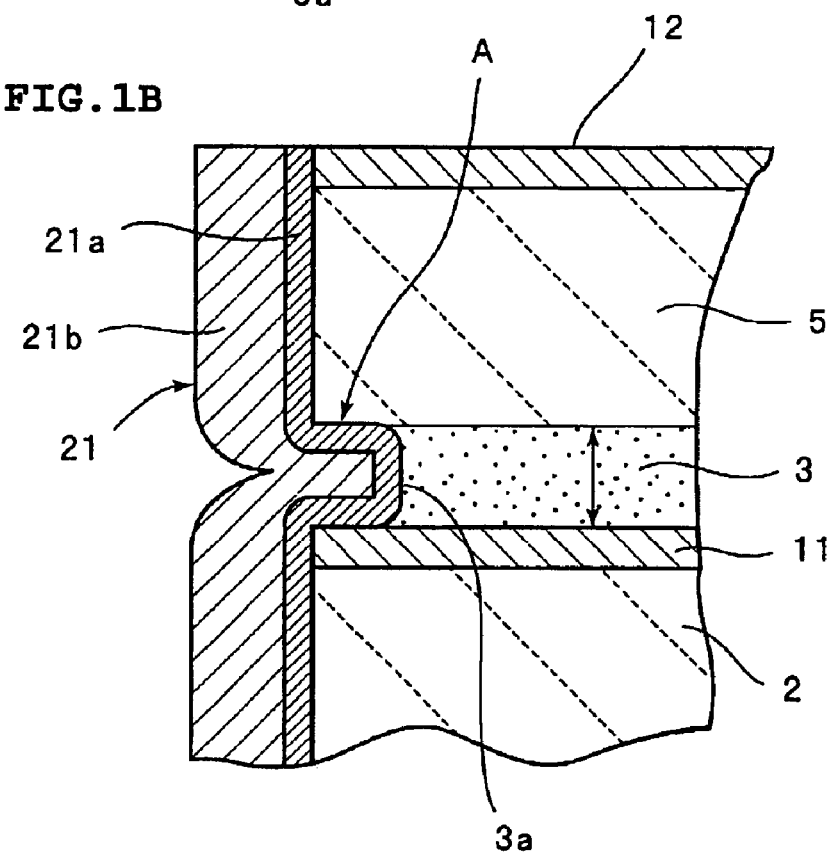
FIG. 1B is a partially cutaway cross-sectional front view showing an essential portion of the piezoelectric resonator component of a preferred embodiment of the present invention.

FIG. 1A is a cross-sectional front view of a piezoelectric resonator component according to a preferred embodiment of the present invention. FIG. 1B is a partially exploded enlarged cross-sectional front view showing an essential portion thereof. A piezoelectric resonator component 1 preferably includes an element substrate 2, and first and second sealing substrates 5 and 6 bonded to the upper and lower surfaces of the element substrate 2 through adhesive layers 3 and 4, respectively.

Figure 3A:
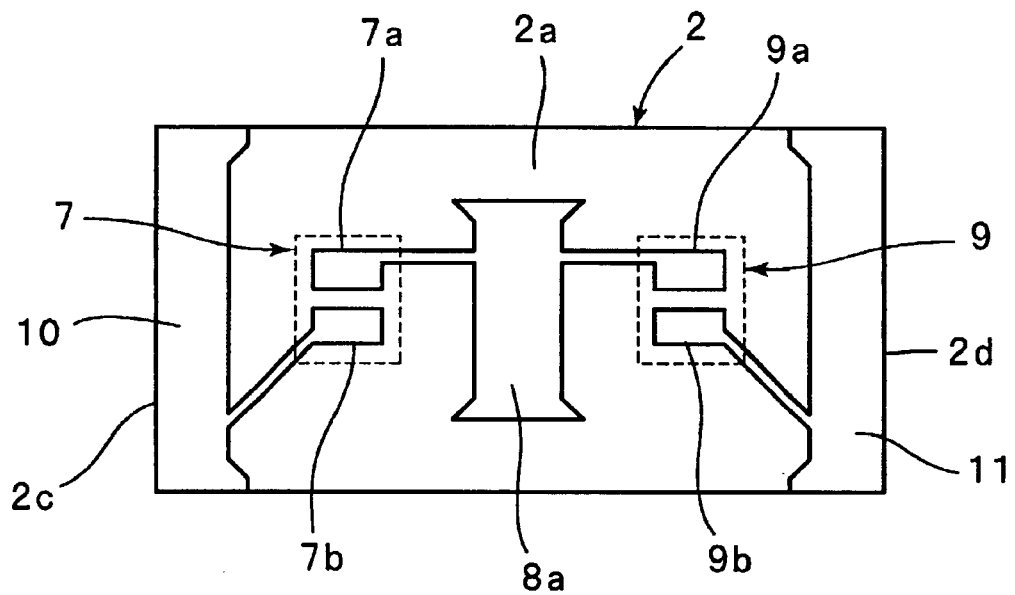
FIG. 3A is a plan view of an element substrate for use in the piezoelectric resonator component of a preferred embodiment of the present invention.
Figure 3B:
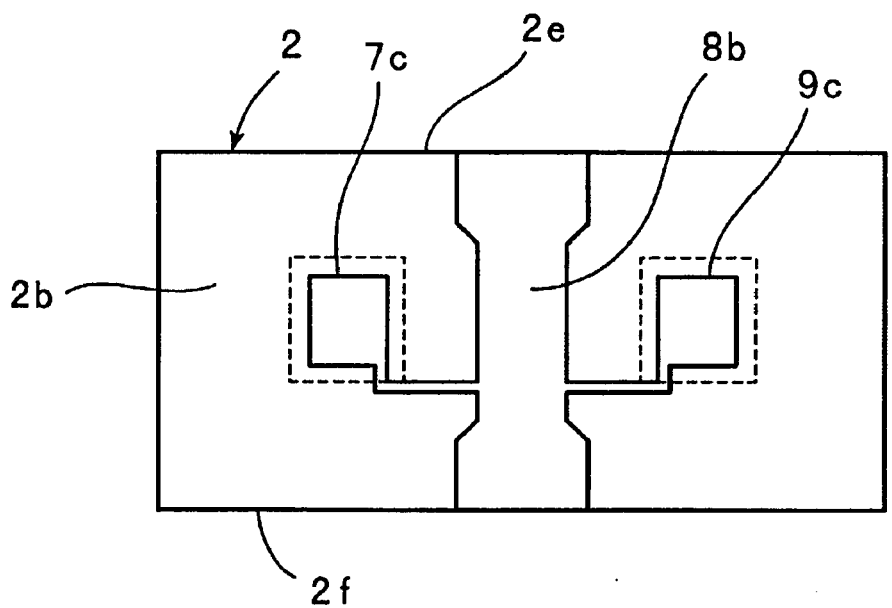
FIG. 3B is a bottom view of the element substrate.

FIGS. 3A and 3B show the electrode configurations on the upper and lower surfaces of the element substrate 2. The element substrate 2 is preferably made of a piezoelectric ceramic or piezoelectric single crystal or other suitable material. The element substrate 2, which is preferably made of the piezoelectric ceramic, is polarized in the thickness direction. First vibration electrodes 7a and 7b are arranged at a predetermined gap on the upper surface 2a of the element substrate 2. Moreover, a common vibration electrode 7c disposed on the lower surface 2b of the element substrate 2 so that the back surfaces of the first vibration electrodes 7a and 7b are opposed to the front surface of the common vibration electrode 7c through the element substrate 2. The vibration electrodes 7a and 7b and the common electrode 7c constitute an energy trap type piezoelectric resonating portion using thickness-longitudinal vibration.

Moreover, capacitor electrodes 8a and 8b are preferably disposed in the approximate center of the element substrate 2 so that the back surface of the electrode 8a is opposed to the front surface of the electrode 8b through the element substrate 2. The capacitor electrodes 8a and 8b define a capacitor portion 8.

A second piezoelectric resonating portion 9 is provided on the side of the capacitor portion 8 opposite to the piezoelectric resonating portion 7. The piezoelectric resonating portion 9 is preferably arranged in the same manner as the piezoelectric resonating portion 7, and includes first and second vibration electrodes 9a and 9b and a common vibration electrode 9c.

The second vibration electrodes 7b and 9b are electrically connected to terminal electrodes 10 and 11 arranged along the side edges 2c and 2d of the element substrate 2, respectively. The vibration electrodes 7a and 9a are electrically connected to the capacitor electrode 8a.

On the lower surface 2a of the element substrate 2, the common vibration electrodes 7c and 9c are electrically connected to the capacitor electrode 8b. The capacitor electrode 8b extends to the side edges 2e and 2f of the element substrate 2, respectively.

Thus, the first and second piezoelectric resonating portions 7 and 9 and the capacitor portion 8 are disposed in the element substrate 2. Thus, a three-terminal type piezoelectric filter having relay capacities between the terminal electrodes 10 and 11 and the capacitor electrode 8b is provided.

Referring to FIG. 1, to provide spaces to prevent disturbance of the vibration of the piezoelectric resonating portions 7 and 9 of the element substrate 2, concavities 5a and 6a are formed on the upper and lower surfaces of the sealing substrates 5 and 6, respectively.

The sealing substrates 5 and 6 may be made of an appropriate material such as insulating ceramics, e.g., alumina or the like, synthetic resins, and other suitable material.

The element substrate 2 and the sealing substrates 5 and 6 are bonded to each other by the adhesive layers 3 and 4 to define a laminate. Outside electrodes 12 to 14 are disposed on the upper surface of the sealing substrate 5. Also, outside electrodes 15 to 17 are disposed on the lower surface of the sealing substrate 6. The outside electrodes 12 and 15 extend to the edges defined by one end surface of the laminate and the upper and lower surfaces thereof, respectively. The outside electrodes 14 and 17 extend to the edges defined by the other end surface of the laminate and the upper and lower surfaces thereof, respectively. In particular, the outside electrodes 12 and 15 and the terminal electrode 10 extend out to the same end surface side of the laminate. Similarly, the outside electrodes 14 and 17 and the terminal electrode 11 extend out to the same end surface side of the laminate. The outside electrodes 13 and 16 extend to both the ends in the width direction of the laminate (in this case, the transverse direction of the laminate in FIG. 1A is defined as the longitudinal direction).

In the piezoelectric resonator component 1 of this preferred embodiment, end surface electrode 21 and 23 are disposed on the end surfaces of the laminate for connection of the terminal electrodes 10 to the outside electrodes 12 and 15 and also for connection of the terminal electrode 11 to the outside electrodes 14 and 17, respectively. The end surface electrodes 21 and 22 preferably include undercoat electrodes 21a and 22a formed by a thin-film forming technique such as vapor deposition, sputtering, or other suitable process, and plating-films 21b and 22b formed on the undercoat electrodes 21a and 22a by a plating technique, respectively.

One of the unique features of this preferred embodiment lies in that each thickness of the end surface electrodes 21 and 22 is preferably between about one half of each thickness of the adhesive layers 3 and 4 and about five times thereof, whereby the reliability of the electrical connection between the end surface electrode 10 and the outside electrodes 12 and 15 and that between the end surface electrode 11 and the outside electrodes 14 and 17 are greatly improved. This will be more apparent from the following description of an example of the production method of other preferred embodiments of the present invention.

Figure 4A:
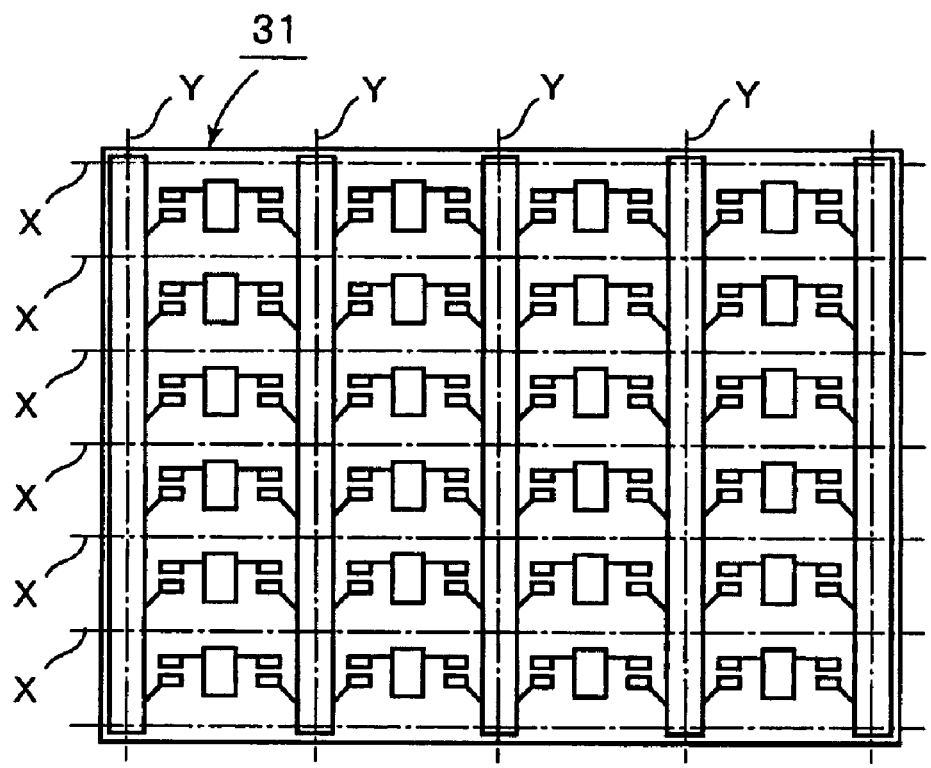
FIG. 4A is a plan view of a mother element substrate.
Figure 4B:
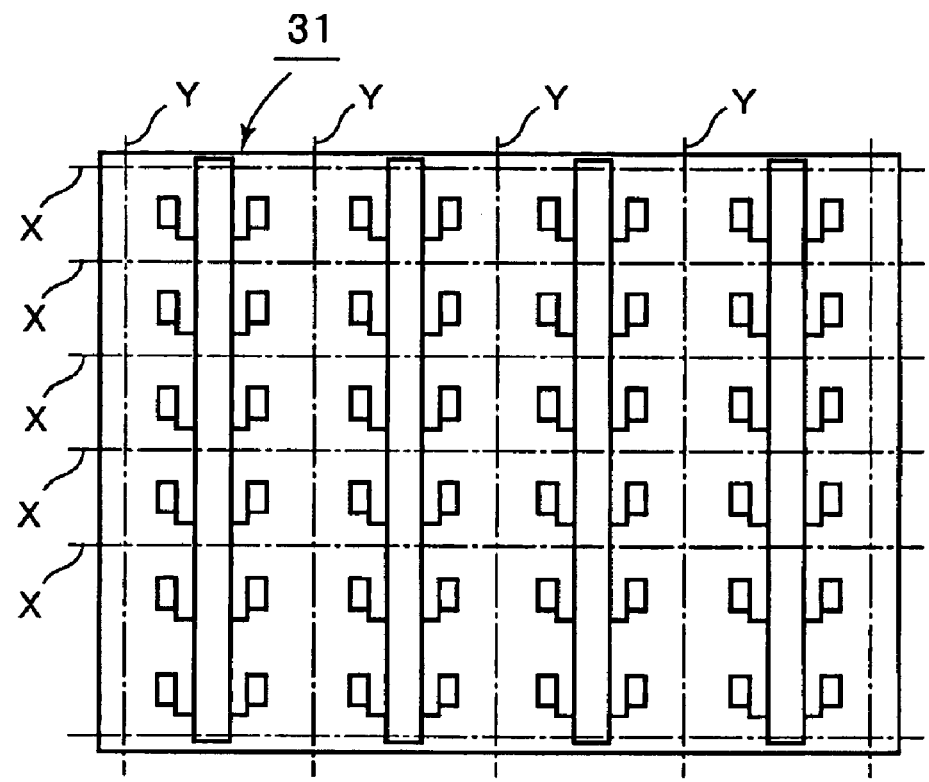
FIG. 4B is a bottom view of the mother element substrate.

Referring to the production of the above-described piezoelectric resonator component 1, ordinarily, a mother element substrate 31 shown in FIGS. 4A and 4B is prepared for high mass-production efficiency. The mother element substrate 31 has a structure in which the element substrates 2 are arranged in a matrix pattern to be integrated with each other. That is, the electrodes which will become elements formed on the individual element substrates are formed on the upper and lower surfaces of the mother element substrate 31.

Figure 5:
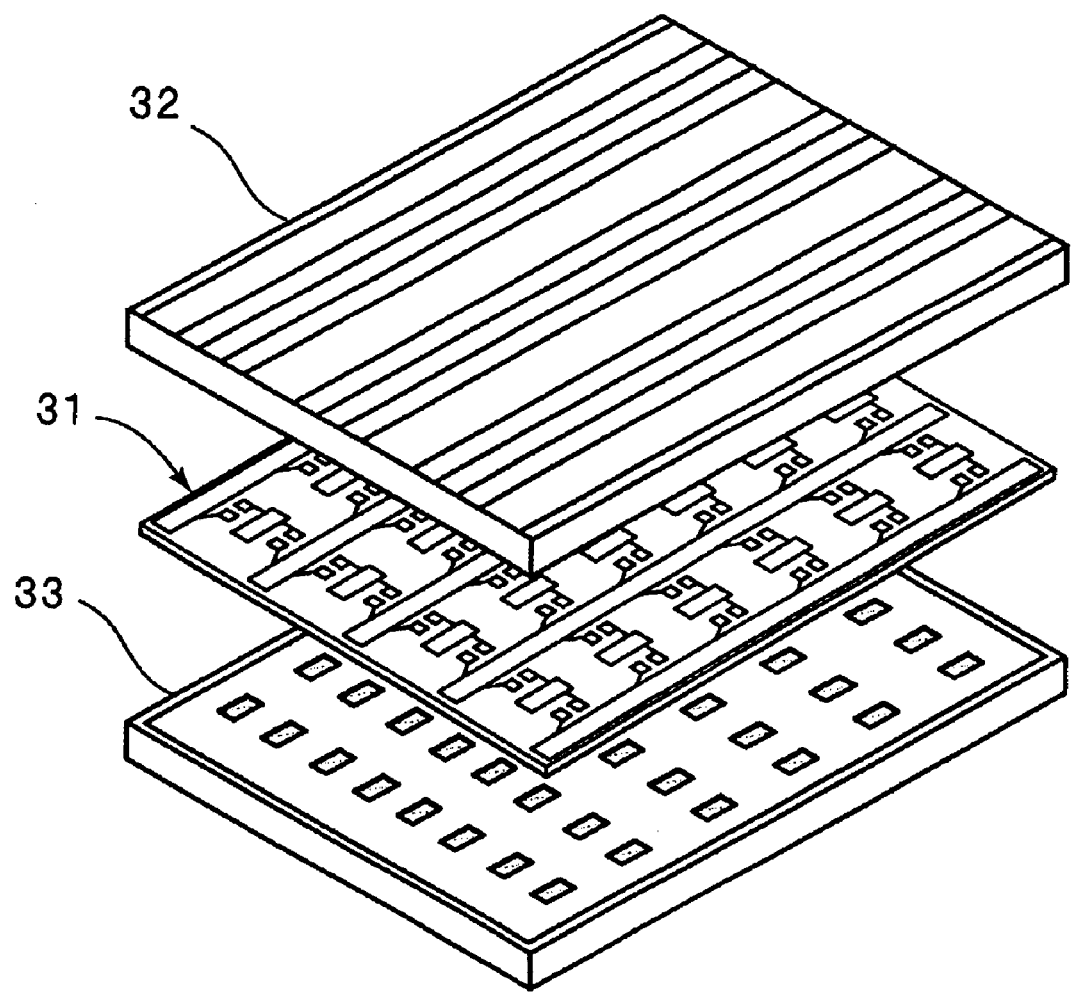
FIG. 5 is an exploded perspective view illustrating the process in which first and second mother sealing substrates are laminated to the mother element substrate.

Thereafter, as shown in FIG. 5, a first mother sealing substrate 32 and a second mother sealing substrate 33 are bonded to the mother element substrate 31 through an adhesive (not shown). As the adhesive, a thermosetting epoxy type adhesive having a superior bond strength is preferably used.

Figure 6:
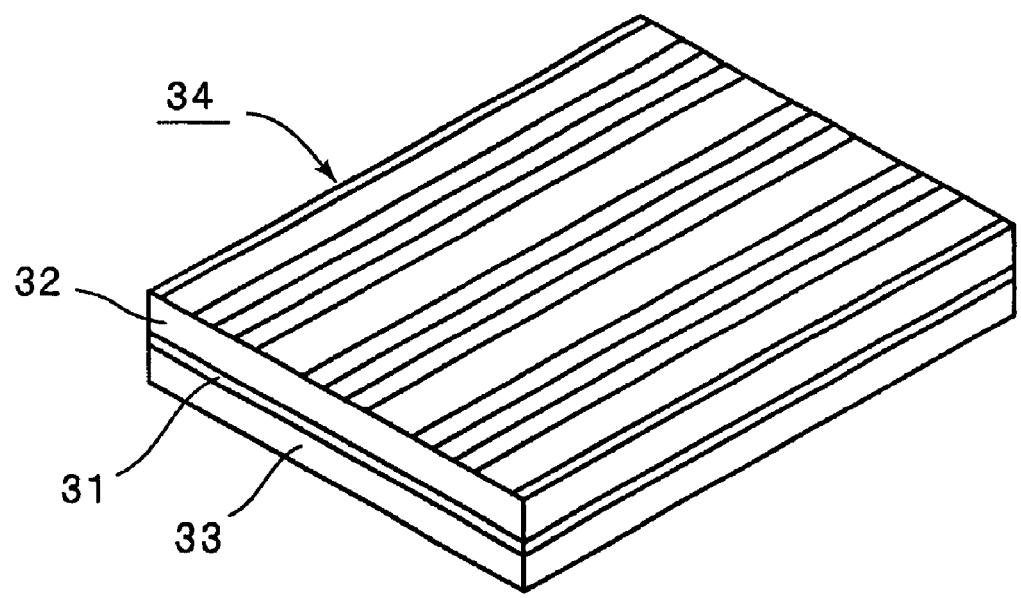
FIG. 6 is a perspective view of a mother laminate.

Thus, a mother laminate 34 shown in FIG. 6 is produced.

Thereafter, the mother laminate 34 is cut in the thickness direction thereof substantially along the dashed lines X and Y shown in FIGS. 4A and 4B to produce the laminates as the individual piezoelectric resonator component units.

Regarding the individual laminates, the terminal electrodes 10 and 11, shown in FIG. 1, on a pair of the end surfaces formed by the cutting are required to be securely exposed. Accordingly, a pair of the end surfaces of the laminate is polished by sandblasting or barrel polishing as carried out in the related art production method. According to this preferred embodiment, the polishing is carried out before the adhesive is completely cured.

Thus, since the adhesive layers 3 and 4 are not completely cured, the outside ends 3a and 4a thereof can be prevented from being scraped off by the polishing. In particular, the polishing carried out when the adhesive layers 3 and 4 have been completely cured may scrape off the cured adhesive and also may remove the adhesive portions to a degree more than the polishing amount by cracking or the like. On the other hand, the polishing of the adhesive layers 3 and 4 carried out when they have been not completely cured does not significantly cause the outside ends 3a and 4a thereof to recede.

Thereafter, the adhesive layers 3 and 4 are completely cured.

Then, after the adhesive layers 3 and 4 are completely cured, undercoat electrodes 21a and 22a shown in FIG. 1A are preferably formed on both the end surfaces of the laminate by a thin-film forming technique such as vapor deposition, sputtering or other suitable process. Ordinarily, the undercoat electrodes 21a and 22a, which are preferably formed by a thin-film forming technique, have a thickness of about 0.05 µm to about 5 µm.

Thereafter, plating films 21b and 22b are formed on the undercoat electrodes 21a and 22a, respectively. The plating films 21b and 22b are preferably formed by plating of Cu, Ni, Sn, Au, Cr, or other suitable material.

One of the unique features of various preferred embodiments of the present invention lies in that each thickness of the end surface electrodes formed as described above, that is, the sum of the undercoat electrode 21a and the plating film 21b or that of the undercoat electrode 22a and the plating film 22b is preferably between about one half of each thickness of the adhesive layers 3 and 4 and about five times of the thickness.

Accordingly, even if the outside end 3a of the adhesive layer 3 is caused to recede from the end surface of the laminate in the polishing step as shown in the partially cutaway surface cross-sectional view of FIG. 1B, an electrode material to form the end surface electrode 21 securely intrudes into a gap A shown in FIG. 1B so as to fill the gap A, since the end surface electrode 21 having a sufficient thickness is formed.

Figure 7:
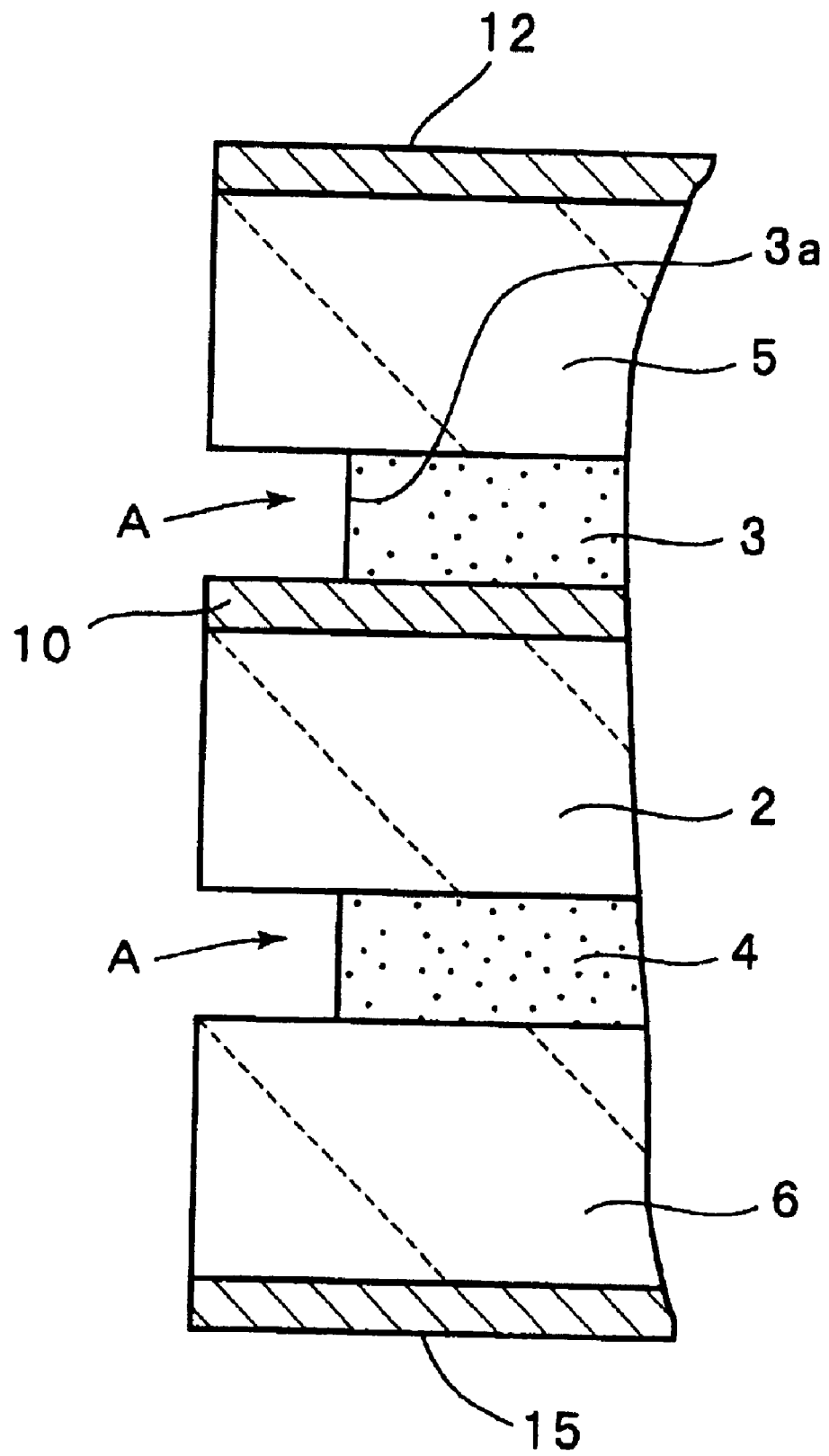
FIG. 7 is a partially cutaway cross-sectional front view illustrating an example of the state of the polished end surface of a laminate formed from the mother laminate.
Figure 8:
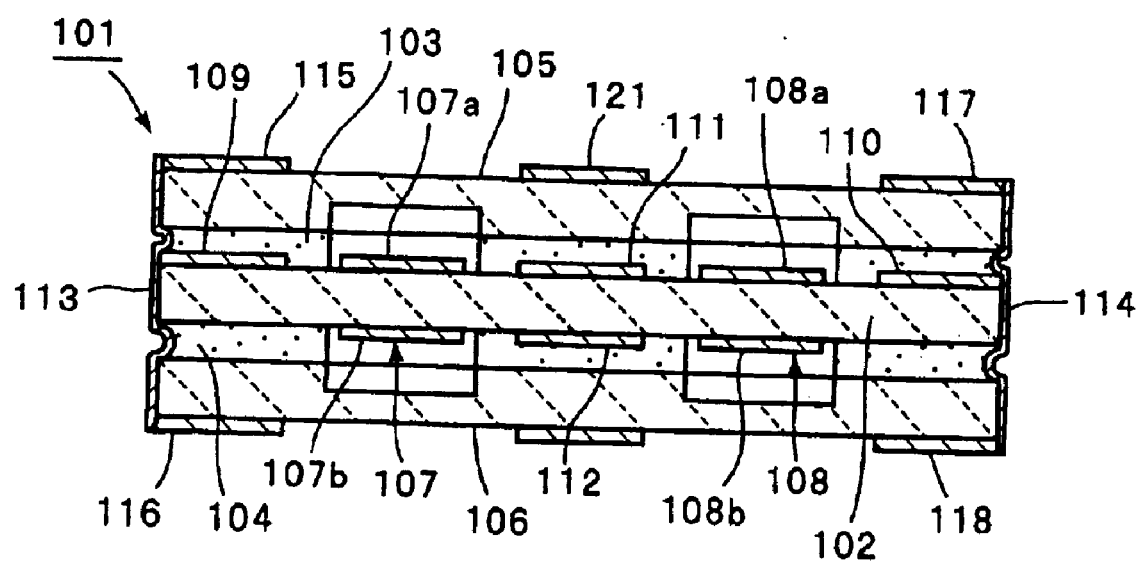
FIG. 8 is a cross-sectional front view of an example of a related art piezoelectric resonator component.
Figure 9:
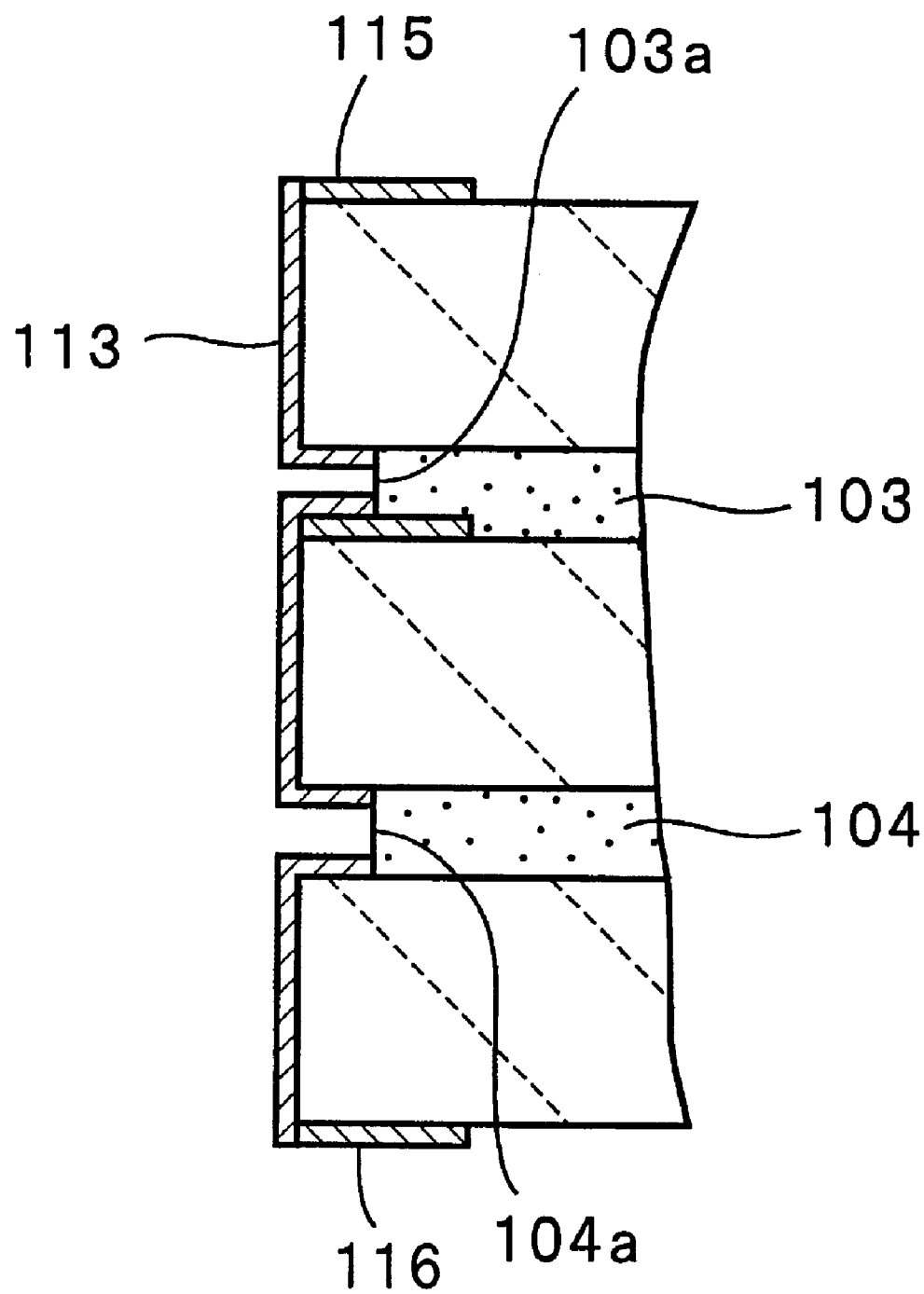
FIG. 9 is a partially cutaway cross-sectional front view illustrating problems with the related art piezoelectric resonator component of FIG. 8.

In particular, the undercoat electrode 21a, which has a relatively small thickness, securely intrudes into the inside of the laminate through the end surface thereof to be provided on the outer surface of the outside end 3a of the adhesive layer 3. Thereafter, the plating film 21b, when it is formed by plating, is securely caused to adhere to the outer surface of the undercoat electrode 21a. In this case, the gap A is completely filled with the electrode material, since the overall thickness of the end surface electrode 21 is preferably at least about one half of the thickness of the adhesive layer. Accordingly, even when the outside end 3a of the adhesive layer 3 recedes as shown in FIG. 7, the electrical connection between the terminal electrode 10 and the end surface electrode 21 can be securely and reliably achieved.

According to this preferred embodiment, the polishing step is preferably performed before the adhesive layer 3 is completely cured, so that the recession of the outside end 3a of the adhesive layer 3 is prevented as described above. It is preferable that the polishing is carried out before the adhesive layer 3 is completely cured. However, according to the present invention, the polishing may be carried out after the complete curing of the adhesive layer 3. In particular, in the case where the polishing is conducted after the complete curing, a material for forming the end surface electrode 21 can be securely filled into the gap A, provided that the thickness of the end surface electrode 21 is at least about one half of the thickness of the adhesive layer 3, even if the outside end 3a of the adhesive layer 3 recedes as in the case of the related art method, as shown in FIG. 7. Thus, the electrical connection between the terminal electrode 10 and the end surface electrode 21 can be securely and reliably achieved.

The electrical connection between the terminal electrode 11 and the end surface electrode 22 can be securely achieved on the other end surface of the laminate, similarly to the above-described electrical connection.

Moreover, the end surface electrodes 21 and 22 extend to the edges defined by the upper and lower surfaces of the laminate and the end surfaces thereof, respectively. Thus, the electrical connections between the terminal electrode 10 and the outside electrodes 12 and 15 and that between the terminal electrode 11 and the outside electrodes 14 and 17 are reliably achieved via the end surface electrodes 21 and 22, respectively.

Simultaneously with the formation of the end surface electrodes 21 and 22, end surface electrodes 23 are formed on the side surfaces of the laminate in the same process for the electrodes 21 and 23. The end surface electrodes 23 are electrically connected to the outside electrodes 13 and 16 and also to the capacitor electrode 8b.

Figure 2:
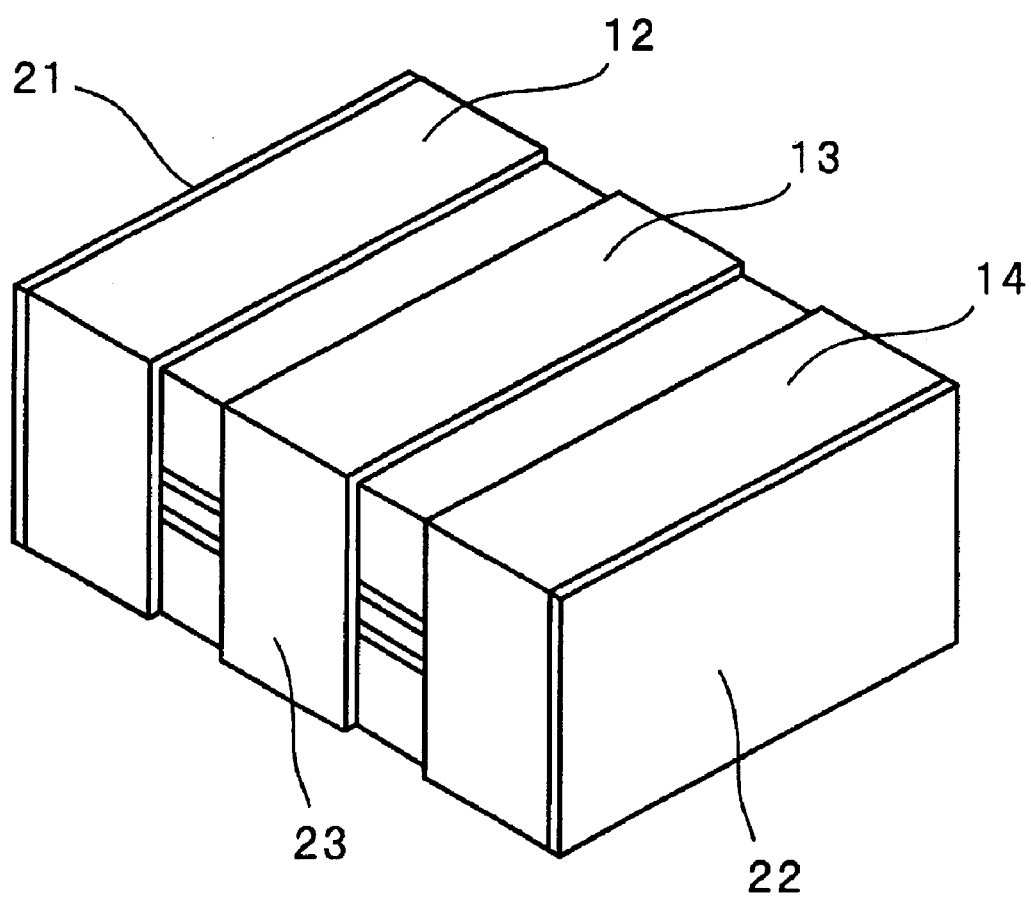
FIG. 2 is a perspective view showing the appearance of the piezoelectric resonator component of a preferred embodiment of the present invention.

Thus, the piezoelectric resonator component 1 shown in FIGS. 1A and 2 is produced. As described above, in the piezoelectric resonator component 1, the terminal electrodes 10 and 11 disposed on the element substrate 2 are reliably and securely connected to the outside electrodes 12, 14, 15, and 17, respectively.

In the above-described preferred embodiments, it is described that each thickness of the end surface electrodes 21 and 22 is preferably at least about one half of each thickness of the adhesive layers 3 and 4. Each thickness of the end surface electrodes 21 and 22 has no particular limit for high reliability of the electrical connection.

However, if each thickness of the end surface electrodes 21 and 22 is excessively large, the end surface electrodes 21 and 22 may be peeled off from the end surfaces of the laminate, caused by a film-stress generated when the end surface electrodes 21 and 22 are formed. Accordingly, desirably, each thickness of the end surface electrodes 21 and 22 is preferably about five times of each thickness of the adhesive layers 3 and 4.

In the above-described preferred embodiments, the element substrate 2 having two piezoelectric filter portions disposed therein is preferably used. The present invention is not limited to a piezoelectric resonator component having such two piezoelectric filter portions and relay capacity portions disposed therein. Generally, the present invention may be applied to lamination type electronic components having different structures using an adhesive for bonding. For example, the present invention may be applied to a piezoelectric resonator component in which sealing substrates are bonded via an adhesive to the upper and lower surfaces of an element substrate having a single piezoelectric resonator disposed therein.

Moreover, the present invention is not restricted to a structure in which sealing substrates are bonded to both sides, that is, the upper and lower surfaces of an element substrate. The present invention may be applied to a lamination type electronic component in which a sealing substrate is bonded to only one side of an element substrate through an adhesive layer.

Moreover, the element substrate is not restricted to a device constituting a piezoelectric resonator or a piezoelectric filter. The element substrate may be applied to a device constituting another electronic component element such as a capacitor or other suitable element.

Furthermore, in the above-described preferred embodiments, as a material to form the adhesive layers 3 and 4, an epoxy type adhesive is preferably used. However, the adhesive constituting the above-described adhesive layers has no particular limitation.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An electronic component comprising:
   an element substrate having an electronic component element disposed therein;
   an adhesive layer disposed on at least one surface of the element substrate;
   a sealing substrate bonded to the element substrate through the adhesive layer;
   a terminal electrode disposed on the surface of the element substrate adjacent to the adhesive layer so as to be exposed at an end surface of a laminate including the element substrate, the adhesive layer, and the sealing substrate;
   an outside electrode disposed on the outer surface of the sealing substrate; and
   an end surface electrode disposed on the end surface of the laminate;
   wherein a thickness of the end surface electrode is between about one half of the thickness of the adhesive layer and about five times of the thickness of the adhesive layer.

2. An electronic component according to claim 1, further comprising another adhesive layers disposed on a surfaces of the element substrate that is opposed to the at least one surface, and another sealing substrate that is bonded to the surfaces of the element substrate that is opposed to the at least one surface.

3. An electronic component according to claim 1, wherein the element substrate includes an energy trap piezoelectric resonating portion.

4. An electronic component according to claim 3, wherein the energy trap piezoelectric resonating portion vibrates in a thickness longitudinal vibration mode.

5. An electronic component according to claim 3, wherein cavities are provided in the element substrate to allow for unhindered vibration of the energy trap piezoelectric resonating portion.

6. An electronic component according to claim 1, wherein the element substrate is made of one of a piezoelectric ceramic and a piezoelectric single crystal.

7. An electronic component according to claim 6, wherein the element substrate is polarized in a thickness direction thereof.

8. An electronic component according to claim 1, wherein the element substrate includes at least two resonating portions.

9. An electronic component according to claim 1, wherein the element substrate, the terminal electrode, the outside electrode and the end surface electrode are arranged to define a three-terminal piezoelectric filter having relay capacities.

10. An electronic component according to claim 1, wherein the outside electrode and the terminal electrode extend out to a common end surface of the laminate.

11. An electronic component according to claim 1, wherein the end surface electrode includes an undercoat electrode.

12. An electronic component according to claim 1, wherein at least two of the end surface electrodes are provided on end surfaces of the laminate and each of the at least two end surface electrodes has a thickness that is between about one half of the thickness of the adhesive layer and about five times of the thickness of the adhesive layer.

* * * * *